United States Patent
Brown et al.

(10) Patent No.: US 9,590,797 B1
(45) Date of Patent: Mar. 7, 2017

(54) EDGE RATE CONTROL CALIBRATION

(71) Applicant: Cavium, Inc., San Jose, CA (US)

(72) Inventors: Jonathan K. Brown, Boston, MA (US); Ethan Crain, Northborough, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 15/143,282

(22) Filed: Apr. 29, 2016

(51) Int. Cl.
*H03D 3/24* (2006.01)
*H04L 7/00* (2006.01)
*H04L 7/033* (2006.01)

(52) U.S. Cl.
CPC .......... *H04L 7/0025* (2013.01); *H04L 7/0087* (2013.01); *H04L 7/0091* (2013.01); *H04L 7/0331* (2013.01)

(58) Field of Classification Search
CPC ... H04L 7/0025; H04L 7/0331; H04L 7/0087; H04L 7/0091
See application file for complete search history.

(56) References Cited

U.S. PATENT DOCUMENTS

| | | | | | |
|---|---|---|---|---|---|
| 2001/0026179 | A1* | 10/2001 | Saeki | ...................... | H03K 5/131 327/147 |
| 2003/0222689 | A1* | 12/2003 | Burdick | ............... | H03K 5/1504 327/170 |
| 2005/0060616 | A1* | 3/2005 | Cho | ...................... | H03K 5/135 714/34 |
| 2010/0027712 | A1* | 2/2010 | Poulton | ............... | H04L 25/0272 375/295 |
| 2013/0055006 | A1* | 2/2013 | Kossel | ...................... | G06F 1/04 713/503 |
| 2014/0035650 | A1* | 2/2014 | Zerbe | ........................ | H03L 7/06 327/299 |
| 2015/0244549 | A1 | 8/2015 | Crain | | |

\* cited by examiner

*Primary Examiner* — Syed Haider
(74) *Attorney, Agent, or Firm* — Hamilton, Brook, Smith & Reynolds, P.C.

(57) ABSTRACT

In an example embodiment, a circuit includes an oscillator providing a set of clock phase signals. A main edge rate controller (ERC) coupled to the oscillator is configured to adjust an edge rate of each clock phase signal of the set of clock phase signals. An interpolator coupled to the main ERC is configured to interpolate the adjusted set of clock phase signals to provide at least one desired phase output signal. An edge rate controller calibrator comprises a ring oscillator including at least three ERCs connected in a loop, a counter configured to count a number of cycles of the ring oscillator over a given period, and a finite state machine (FSM) configured to compare the counter count to a given value corresponding to an operating frequency of the circuit and to adjust operation of the circuit based on the comparison.

17 Claims, 4 Drawing Sheets

EDGE RATE CONTROL CALIBRATION

BACKGROUND

A significant challenge in integrated circuits (ICs) is clock and data recovery (CDR). In order for one IC (the transmitter) to talk to another (the receiver), their clocks must be aligned, so that data can be received. A circuit structure called an interpolator is typically used to adjust the phase of the clock in the receiver. To achieve good performance from the interpolator, the edge rate of the incoming oscillator (OSC) must be carefully controlled. An edge rate controller (ERC) provides this functionality. Slow edges from the ERC provide the interpolator with more linear inputs, which improves the overall linearity of the interpolator and increases stability of the CDR loop. Slower edges from the ERC are also more susceptible to process, voltage and temperature (PVT) variation. If the edges become too slow, the interpolator stops functioning. Thus, the edge rate of the ERC must be carefully controlled and monitored.

SUMMARY

The challenge for the ERC is that modern ICs often communicate with one another at a number of different clock frequencies, so it must be tunable across a large range of frequencies. In addition, variation in the fabrication process, current operating voltage, and ambient temperature will each change the performance of the ICs. While process variation can be accounted for with a one-time calibration, voltage and temperature can vary throughout the life of a product. Thus, the ERC should track these changes in order to maintain optimal performance in the system.

The present disclosure describes circuit and method for controlling edge rate in order for a system to operate across a large range of frequencies as well as process, voltage, and temperature (PVT) variation.

Accordingly, a circuit includes an oscillator providing a set of clock phase signals. A main edge rate controller (ERC) coupled to the oscillator is configured to adjust an edge rate of each clock phase signal of the set of clock phase signals. An interpolator coupled to the main ERC is configured to interpolate the adjusted set of clock phase signals to provide at least one desired phase output signal. An edge rate controller calibrator comprises a ring oscillator including at least three ERCs connected in a loop, a counter configured to count a number of cycles of the ring oscillator over a given period, and a finite state machine (FSM) configured to compare the counter count to a given value corresponding to an operating frequency of the circuit and to adjust operation of the circuit based on the comparison.

The given value corresponding to the operating frequency may be stored in memory.

The FSM may be configured to adjust operation of the circuit by iteratively adjusting a setting value for the at least three ERCs, resetting the counter to count cycles of the ring oscillator over a subsequent given period and comparing the counter count for the subsequent given period to the given value until an optimal setting value is reached.

The FSM may be configured to adjust operation of the circuit further by adjusting a setting value for the main ERC based on the optimal setting value.

Each ERC may include a set of tristate inverters connected in parallel, with each tristate inverter of the set of tristate inverters selectively enabled or disabled based on the setting value.

The FSM may be configured to ignore the counter count after an initial operation period.

The FSM may be configured to intermittently or continuously compare the counter count to the given value corresponding to the operating frequency of the circuit.

A method of operating a circuit in accordance with the principles of the present disclosure includes adjusting, at a main edge rate controller (ERC), an edge rate of each clock phase signal of a set of clock phase signals; interpolating, at an interpolator, the adjusted set of clock phase signals to provide at least one desired phase output signal; counting, in a counter, a number of cycles of a ring oscillator over a given period, the ring oscillator having at least three ERCs connected in a loop; and comparing the counter count to a given value corresponding to an operating frequency of the circuit and adjusting operation of the circuit based on the comparison.

In another aspect, a circuit includes an oscillator providing a set of clock phase signals and an edge rate controller (ERC) coupled to the oscillator and configured to adjust an edge rate of each clock phase signal of the set of clock phase signals. An interpolator coupled to the ERC is configured to interpolate the adjusted set of clock phase signals to provide at least one desired phase output signal. The ERC comprises a set of tristate inverters connected in parallel, each tristate inverter of the set of tristate inverters selectively enabled or disabled based on a setting value.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
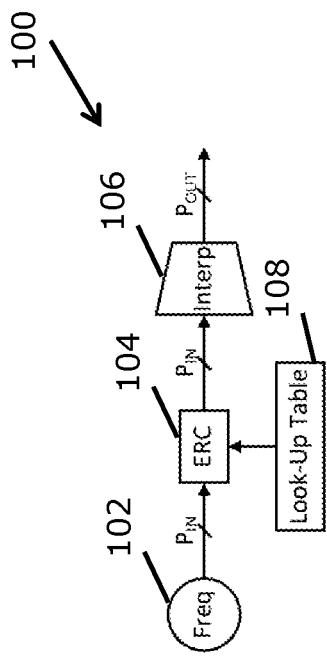
FIG. 1 is a block diagram of a first embodiment of an edge rate control circuit.

FIG. 1 is a block diagram of a first embodiment of an edge rate control circuit 100. A frequency generator 102, such as an oscillator within a phase-locked loop (PLL), generates $P_{IN}$ (typically 4 or 8) coarse clock phases. Those phases are passed through an ERC 104, which adjusts the edge rate of each signal to maximize the performance of interpolator 106. The interpolator 106 generates $P_{OUT}$ (typically 2) phases that may be used for clock and data recovery. The edge rate of the ERC 104 is controlled with a look-up table 108. The look-up table 108 includes entries that map the operating frequency of the circuit to a code for the ERC 104.

Figure 2:
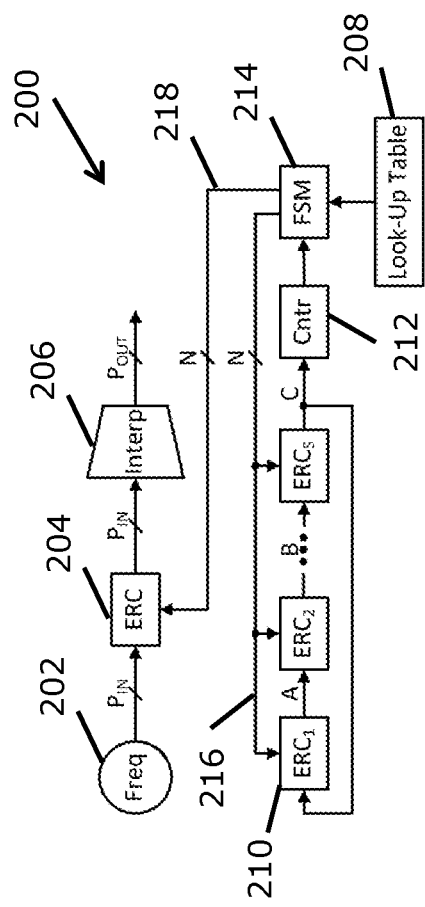
FIG. 2 is a block diagram of a second embodiment of an edge rate control circuit.

FIG. 2 is a block diagram of a second embodiment of an edge rate control circuit 200. The circuit 200 is configured to adjust to PVT variation. The frequency generator 202, ERC 204, and interpolator 206 are unchanged from FIG. 1. The edge rate, however, is monitored with a replica set of ERC blocks $ERC_1$, $ERC_2$, ... $ERC_s$ 210 cascaded together and connected in a loop. A counter 212 counts the number of cycles of the ERC loop over a known time. A finite state machine (FSM) 214 converts the count to a period of the loop and compares the measured period with the desired period stored in a look-up table 208. While the look-up table 208 has entries for each operating frequency similar to the look-up table 108, it also holds data strongly correlated with the operating frequency. Thus, the FSM 214 is able to monitor changes in process, voltage, temperature, and frequency and adjust the edge rate of the ERC 204 to maximize the linearity of the interpolator 206.

As an example, consider a scenario in which performance slows for an IC containing the circuit 200. Using the configuration in FIG. 2, the period of the ERC loop would increase. A larger period would result in a smaller count from the counter 212. The FSM 214 would calculate the period from the count and compare the result with the desired period based on a selected given value in the look-up table 208. The FSM 214 would then adjust an ERC setting value or code 216 to each ERC 210 of the ERC loop, so that the edge rate becomes faster. The period of the ERC loop would decrease, and the number of cycles measured by the counter would increase. The FSM 214 would continue to decrease the period of the ERC loop until the period best matches the selected value from the look-up table 208. Once the optimal ERC setting value or code has been determined for the ERC loop, that setting value or code is applied at 218 to the main ERC 204.

It should be understood that operation of the circuit for another scenario in which an IC performs faster due to PVT variation would result in the FSM 214 making similar adjustments, but to increase the period of the ERC loop until the period best matches the selected value from the look-up table 208.

Figure 3:
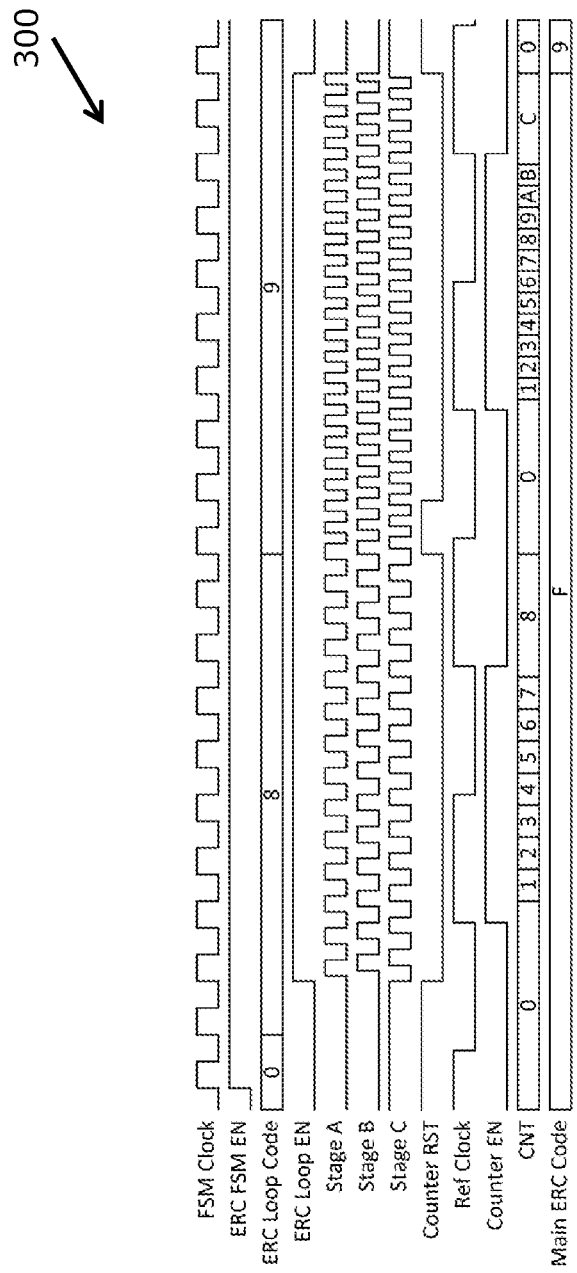
FIG. 3 illustrates a timing diagram for the edge rate control circuit of FIG. 2.

FIG. 3 illustrates a timing diagram for the edge rate control circuit of FIG. 2. A higher-level system enables the FSM 214 and provides an external clock. The FSM 214 selects an ERC setting value or loop code 216, and then enables the ERC loop, which begins the Stage A-C ERC clock signals. Next, the FSM 214 de-asserts the counter reset. On the rising edge of the reference clock, the counter 212 begins. On the following rising edge, the counter 212 stops, and the count is recorded by the FSM 214. The FSM 214 resets the counter 212 and sets the ERC loop to a new setting value or code. This sequence of setting a new code and counting the number of cycles by the ERC loop continues until the best ERC loop code is found and then passed to the main ERC 204. The particular example scenario in FIG. 3 shows the ERC loop code changing from a value equal to 8 to a value equal to 9, correcting for the slow performance. In other scenarios in which the IC performance is faster due to PVT variation, the timing diagram would likely show the ERC code being adjusted downward over one or more counter cycles.

The timing diagram in FIG. 3 simplified the counter count corresponding to ERC code =8 and ERC code =9 for illustration purposes. More realistic counter counts would be in the 100s or 1000s, for example.

Additional states may exist in the FSM and the timing diagram in FIG. 3 is illustrative. For example, the timing diagram does not show clock retiming or long wait times that may be necessary between each clock interface. For example, the 'Counter EN' is launched on the positive edge of 'Ref Clock', which may be much slower than 'Stage A-C' clocks, thus requiring synchronization. Along the same lines, the system may need to wait multiple FSM clock cycles before reading the 'CNT' after 'Counter EN' de-asserts, to ensure that the count is not changing.

Table 1 illustrates example content and format for an embodiment of the look-up table 208. As shown, the look-up table holds one count for each ERC code. For simplicity in storing this information, each count is the minimum count desired for that ERC code. A count also corresponds to an expected RX clock frequency.

| Look-Up Table ERC Loop Code | Look-Up Table Min RX Clock Frequency (Hz) | Look-Up Table Min Count |
| --- | --- | --- |
| 1 | <8.00E+08 | <19 |
| 2 | 8.00E+08 | 19 |
| 3 | 1.30E+09 | 31 |
| 4 | 1.90E+09 | 46 |
| 5 | 2.70E+09 | 65 |
| 6 | 3.60E+09 | 86 |
| 7 | 4.50E+09 | 108 |
| 8 | 5.60E+09 | 134 |
| 9 | 6.70E+09 | 161 |
| 10 | 7.90E+09 | 190 |
| 11 | 9.40E+09 | 226 |
| 12 | 1.08E+10 | 259 |
| 13 | 1.19E+10 | 286 |
| 14 | 1.28E+10 | 307 |
| 15 | 1.35E+10 | 324 |

Table 1: Example ERC loop codes, clock frequencies and minimum counter counts.

As an example, consider a system configuration in which a transmitter and receiver are communicating at a 5.8 GHz RX clock frequency. The example look-up table shown in Table 1 indicates that for this RX clock frequency, the ERC loop code should be 8 and the ERC count should be ≥134 and <161. The FSM is then run with the ERC loop code value of 8, and the counter reports that the actual count is 130 which might occur in an IC with slower performance. Since the counter count of 130 is less than the minimum count of 134 in the look-up table for this RX clock frequency, the FSM is next run with an ERC loop code value of 9.

In this example scenario, with the FSM now run with the ERC loop code value of 9, the counter reports, for example, that the count is 155.

Since the counter count of 155 is greater than the minimum count of 134 indicated in the look-up table for this RX clock frequency, the ERC code value of 9 is selected and applied as the main ERC code to the main ERC 204 (FIG. 2).

The ERC setting value or code may be mapped from a binary number to a thermometer-code representation of that number using, for example, RTL code. Thermometer coding means that an ERC code of 9, for example, maps to 9 ones-bits with the remaining bits as zero-bits. Literally, the code is the number of ones-bits.

For the embodiment described herein, the range in period of the ERC loop is defined by the number of tristate inverters. For example, for a system that has 15 tristate inverters, the period of the ERC loop is expected to change from approximately 1× to 15×. It should be understood that 15 is an example number of tristate inverters and that other numbers of tristate inverters can be used. It should also be understood that one D flip-flop does not necessarily connect to exactly one tristate inverter, and the ERC code space could be smaller than the number of tristate inverters.

Figure 4:
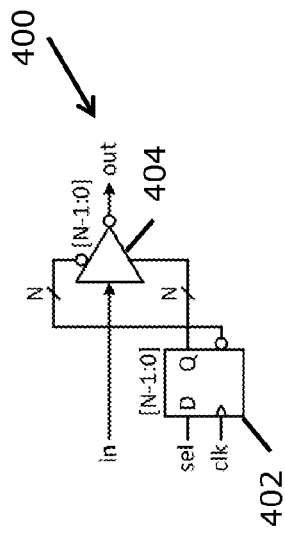
FIG. 4 is a block diagram of an edge rate controller.

FIG. 4 is a block diagram of an example embodiment of an edge rate controller 400. In this embodiment, the ERC 400 includes a set of D flip-flops 402 and a set of tristate inverters 404. A bus, sel[N-1:0], corresponding to the ERC loop setting value or code, selectively enables or disables the tristate inverters 404 through the flip-flops 402. In this embodiment, there is one flip-flop for each tri-state inverter. However, a one-to-one correspondence between flip-flops and tristate inverters is not required. One flip-flop can drive multiple tristate inverters. In a second embodiment, for example, the ERC includes 15 flip-flops and 41 tristate inverters. In this second embodiment there are steps of 1, 2, 3, 4, 6, 8, 10, 13, 16, 19, 23, 27, 31, 37, 41 enabled. Other embodiments can have other numbers of flip-flops and tristate inverters. It should also be understood that in other embodiments of an ERC, inverters with tunable capacitor loads or other logic elements such as latches or gates can be used in addition to D flip-flops.

Figure 5:
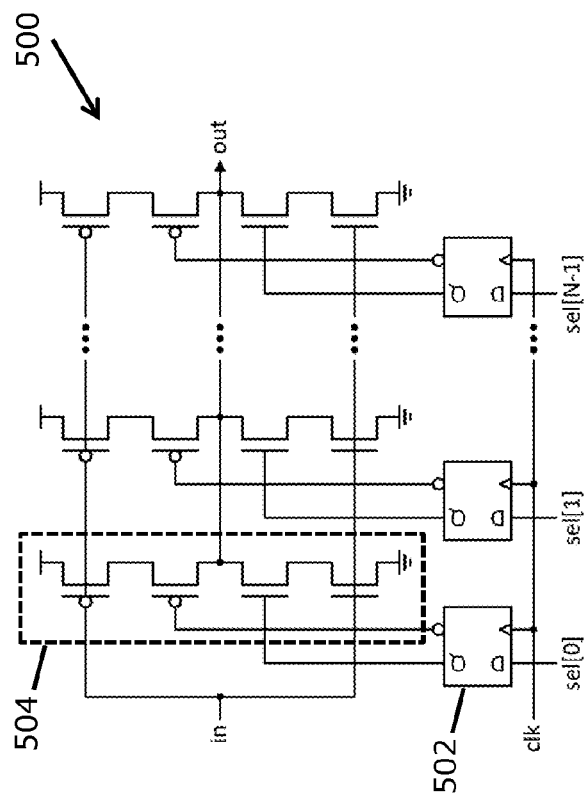
FIG. 5 is a circuit block diagram of the edge rate controller of FIG. 4.

In the circuit block diagram of FIG. 5, the ERC 500 includes tristate inverters 504 that are connected in parallel through shared input, in, and output, out, nets. To decrease the period of the ERC-based ring oscillator, the drive strength of each ERC stage is increased by enabling more of the tristate inverters 504 through the flip-flops 502. The tristate inverters, however, are not perfect switches. When they are disabled, they function as open switches, but when they are enabled, they have parasitic on resistance, $R_{ON}$.

Figure 6:
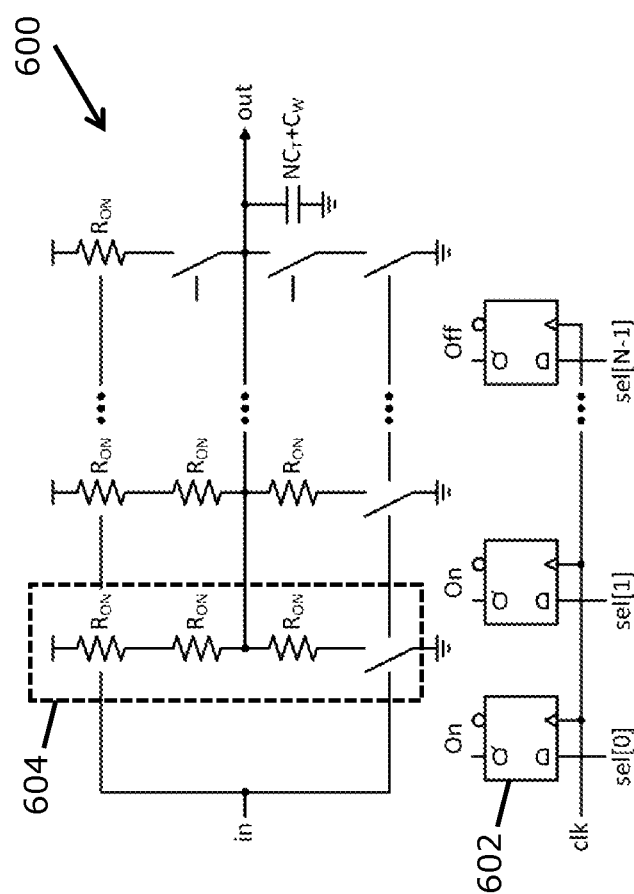
FIG. 6 illustrates a resistor-capacitor equivalent model for the example configuration of tristate inverters shown in FIG. 5.

FIG. 6 illustrates a resistor-capacitor equivalent model for the example configuration of tristate inverters shown in FIG. 5. For example, an enabled tristate inverter 604 is shown according to the resistor-capacitor equivalent model. Then, the total resistance, R, of the ERC is given by:

$$R = 2R_{ON}/N_{EN}$$

where $N_{EN}$ is the number of enabled tristate inverters out, and N is the of the total number of tristate inverters. The total capacitance, C, at the ERC output consists of parasitic wire capacitance, $C_w$, and parasitic transistor capacitance, $C_T$, which scales with the number of tristate inverters. Total capacitance is then given by:

$$C = NC_T + C_w$$

The propagation delay through a single inverter is 0.69 RC. Thus, the period of the ERC ring oscillator, T, is approximately given by:

$$T = 2S(0.69RC) = 1.38S(2R_{ON}/N_{EN})(NC_T + C_w)$$

where S is the number or stages in the ring. If the wire capacitance is small relative to $NC_T$, then the period is inversely proportional to $N_{EN}$. Meanwhile, the range in periods is given by N/1 to N/N, so a larger number of inverters provide a larger range in period.

While this invention has been particularly shown and described with references to example embodiments thereof, it will be understood by those skilled in the art that various changes in form and details may be made therein without departing from the scope of the invention encompassed by the appended claims.

What is claimed is:

1. A circuit comprising:
    an oscillator providing a set of clock phase signals;
    a main edge rate controller (ERC) coupled to the oscillator and configured to adjust an edge rate of each clock phase signal of the set of clock phase signals;
    an interpolator coupled to the main ERC and configured to interpolate the adjusted set of clock phase signals to provide at least one desired phase output signal;
    an edge rate controller calibrator comprising a ring oscillator including at least three ERCs connected in a loop, a counter configured to count a number of cycles of the ring oscillator over a given period, and a finite state machine (FSM) configured to compare the counter count to a given value corresponding to an operating frequency of the circuit and to adjust operation of the circuit based on the comparison.

2. The circuit of claim 1, wherein the given value corresponding to the operating frequency is stored in memory.

3. The circuit of claim 1, wherein the FSM configured to adjust operation of the circuit includes iteratively adjusting a setting value for the at least three ERCs, resetting the counter to count cycles of the ring oscillator over a subsequent given period and comparing the counter count for the subsequent given period to the given value until an optimal setting value is reached.

4. The circuit of claim 3, wherein the FSM configured to adjust operation of the circuit further includes adjusting a setting value for the main ERC based on the optimal setting value.

5. The circuit of claim 4, wherein each ERC comprises a set of tristate inverters connected in parallel, each tristate inverter of the set of tristate inverters selectively enabled or disabled based on the setting value.

6. The circuit of claim 1, wherein the FSM is configured to ignore the counter count after an initial operation period.

7. The circuit of claim 1, wherein the FSM is configured to intermittently compare the counter count to the given value corresponding to the operating frequency of the circuit.

8. The circuit of claim 1, wherein the FSM is configured to continuously compare the counter count to the given value corresponding to the operating frequency of the circuit.

9. The circuit of claim 1, wherein the given period is a reference clock period derived from a PLL reference clock.

10. A method of operating a circuit, the method comprising:
    adjusting, at a main edge rate controller (ERC), an edge rate of each clock phase signal of a set of clock phase signals;
    interpolating, at an interpolator, the adjusted set of clock phase signals to provide at least one desired phase output signal;
    counting, in a counter, a number of cycles of a ring oscillator over a given period, the ring oscillator having at least three ERCs connected in a loop; and
    comparing the counter count to a given value corresponding to an operating frequency of the circuit and adjusting operation of the circuit based on the comparison.

11. The method of claim 10, wherein the given value corresponding to the operating frequency is stored in memory.

12. The method of claim 10, wherein adjusting operation of the circuit includes iteratively adjusting a setting value for the at least three ERCs, counting cycles of the ring oscillator over a subsequent given period and comparing the counter count for the subsequent given period to the given value until an optimal setting value is reached.

13. The method of claim 12, wherein adjusting operation of the circuit further includes adjusting a setting value for the main ERC based on the optimal setting value.

14. The method of claim 10, further comprising ignoring the counter count after an initial operation period.

15. The method of claim 10, further comprising intermittently comparing the counter count to the given value corresponding to the operating frequency of the circuit.

16. The method of claim 10, further comprising continuously comparing the counter count to the given value corresponding to the operating frequency of the circuit.

17. The method of claim 10, wherein the given period is a reference clock period derived from a PLL reference clock.

* * * * *